United States Patent
Esman

(10) Patent No.: US 11,515,946 B1
(45) Date of Patent: Nov. 29, 2022

(54) SYSTEM AND METHOD FOR ANALOG ESTIMATION AND STREAMING OF A SPECTRAL CORRELATION FUNCTION (SCF)

(71) Applicant: Rockwell Collins, Inc., Cedar Rapids, IA (US)

(72) Inventor: Daniel J. Esman, Ellicott City, MD (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 17/535,064

(22) Filed: Nov. 24, 2021

(51) Int. Cl.
*H04B 10/2575* (2013.01)
*H04B 10/54* (2013.01)

(52) U.S. Cl.
CPC ....... *H04B 10/541* (2013.01); *H04B 10/2575* (2013.01)

(58) Field of Classification Search
None
See application file for complete search history.

(56) References Cited

U.S. PATENT DOCUMENTS

| | | | | |
|---|---|---|---|---|
| 9,287,993 | B1* | 3/2016 | Adleman | H04B 10/2575 |
| 10,411,810 | B2* | 9/2019 | Kuo | H04B 10/616 |
| 10,523,329 | B2 | 12/2019 | Esman et al. | |
| 10,727,940 | B2 | 7/2020 | Cyr et al. | |
| 11,356,173 | B2* | 6/2022 | Esman | H04B 10/00 |
| 2018/0131445 | A1* | 5/2018 | Esman | H04B 10/0795 |
| 2019/0339548 | A1* | 11/2019 | Ataie | H04J 14/00 |

OTHER PUBLICATIONS

Argumanez, Humberto Escudero et al., "Tactical communication systems based on civil standards: Modeling in the MiXiM framework", arXiv:1409.1006v1 [cs.NI] Sep. 3, 2014, 7 pages.
Esman, Daniel et al., "Comb-Assisted Cyclostationary Analysis of Wideband RF Signals", Journal of Lightwave Technology, 2017, pp. 1-1. 10.1109/JLT.2017.2715336, URL:https://www.researchgate.net/publication/317595924_Comb-Assisted_Cyclostationary_Analysis_of_Wideband_RF_Signals/citation/download.
Langston, J. et al., "Optical Cyclostationary Processor for Spectrum Sensing," 2019 IEEE Avionics and Vehicle Fiber-Optics and Photonics Conference (AVFOP), 2019, pp. 1-2, doi: 10.1109/AVFOP.2019.8908202, URL: https://ieeexplore.ieee.org/abstract/document/8908202.

* cited by examiner

*Primary Examiner* — Jai M Lee
(74) *Attorney, Agent, or Firm* — Suiter Swantz pc llo

(57) ABSTRACT

A system and method for analog estimation of a spectral correlation function (SCF) provides a photonic carrier to generate a signal comb and offset comb, each comprising N comb tones separated by respective repetition rates $\Delta F$ and $\Delta F + \delta F$. The signal and offset combs are amplitude-modulated according to an inbound RF signal of interest and filtered via periodic optical filters to produce a sequence of N Fourier components of the signal comb and N Fourier components of the offset comb, each filtered signal comb component overlapping with a filtered offset comb component. In-phase/quadrature (I/Q) components of the products of each component of the complex conjugate of the filtered offset comb and the overlapping counterpart of the filtered signal comb are generated in an optical receiver and digitized into slices of the SCF at a fixed time instance and center frequency, correlated at various cyclic separations $\alpha$.

13 Claims, 11 Drawing Sheets

800

810 — Generating, by filtering the signal comb and the offset comb via a pair of primary periodic optical filters, a first filtered signal comb and a first filtered offset comb, the first filtered signal comb comprising $M * N$ first Fourier series components and the first filtered offset comb comprising $M * N$ second Fourier series components correlated with the $M * N$ first Fourier series components at a spectral separation $k\delta f$ 812 — Selecting, by filtering the first filtered offset comb and the first filtered signal comb via a pair of secondary periodic optical filters:
  at least one second filtered offset comb comprising $N$ second Fourier series components and at least one second filtered signal comb comprising $N$ second Fourier series components,
  wherein each pair of a second Fourier series component of the second filtered offset comb and a corresponding second Fourier series component of the second filtered offset comb corresponds to an overlapping optical frequency and to a cyclic separation $a_n$

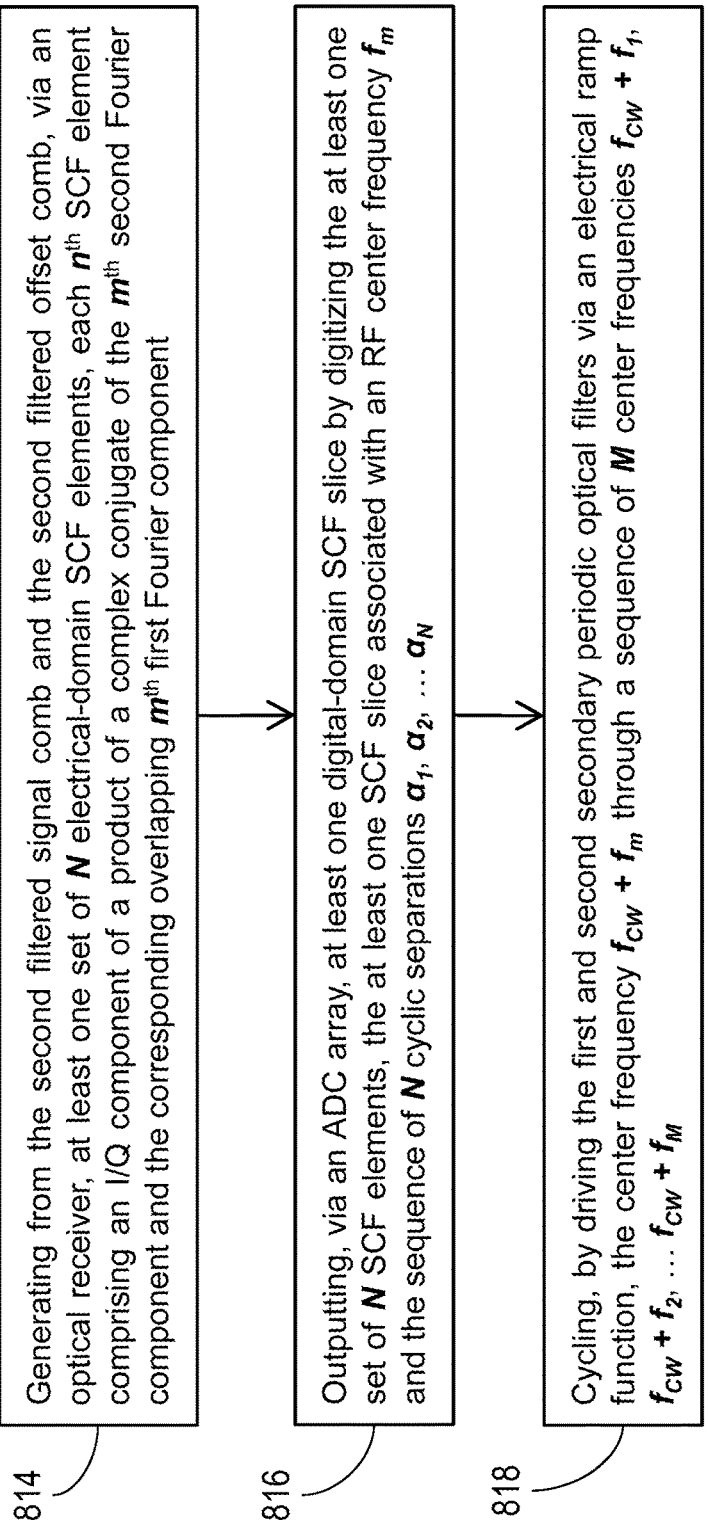

SYSTEM AND METHOD FOR ANALOG ESTIMATION AND STREAMING OF A SPECTRAL CORRELATION FUNCTION (SCF)

TECHNICAL FIELD

The subject matter disclosed herein is directed generally to receiver systems and more particularly to photonic-driven systems for analyzing received signals.

BACKGROUND

Robust intelligence, surveillance, and reconnaissance (ISR) applications require access to, and understanding of, the congested and contested radio frequency (RF) spectrum. In particular, exploiting second-order cyclostationarity (SOCS) allows not only for signals to be detected but for external "fingerprints" of the signal (e.g., modulation type and shape, geolocation, transmitting equipment) to be derived via, for example, a spectral correlation function (SCF) of the signal. Conventional estimation digitizes the inbound RF signal via front-end analog-digital converters (ADC) and performs fast Fourier transform (FFT) and correlation computations in the digital domain, which are respectively $O$ (n log n) and $O$ ($n^2$) level algorithms. In addition to introducing significant latency, the level of complexity required for digital FFT and correlation computations scales with bandwidth. Further, conventional SCF estimators require a front-end ADC which limits the resolution of the captured signal and the effective capture bandwidth.

SUMMARY

In a first aspect, a system for analog estimation and streaming of a spectral correlation function (SCF) for a particular radio frequency (RF) input signal of interest is disclosed. In embodiments, the system includes a continuous-wave (CW) laser or other like photonic source capable of generating a photonic carrier at an optical frequency $f_{CW}$. The photonic carrier is split and passed into a pair of Vernier optical frequency comb generators (OFCG) driven by analog signals with offset repetition rates. The first OFCG replicates the photonic carrier onto a uniform frequency grid to generate a signal comb comprising N comb tones separated by a first repetition rate (e.g., $\Delta F$). The second OFCG also replicates the photonic carrier onto a uniform frequency grid, but generates an offset comb wherein the N comb tones are separated by a second repetition rate offset with respect to the first repetition rate (e.g., $\Delta F+\delta F$). Mach-Zehnder or like electro-optical (EO) amplitude modulators modulate the signal comb and offset comb based on the RF input signal of interest. The modulated signal comb and offset comb are passed through a pair of primary optical filters filtering out from the signal comb a set of M Fourier series components per comb tone (e.g., M*N total components) and filtering out from the offset comb M Fourier series components per comb tone correlating with the M Fourier series components per comb tone filtered from the signal comb. Similarly, the filtered signal comb and filtered offset comb are passed through a pair of secondary periodic optical filters, selecting from the filtered offset comb a single Fourier series component per comb tone (e.g., a set of N Fourier series components), and selecting from the filtered signal comb the N Fourier series components overlapping in optical frequency with the Fourier series components selected from the filtered offset comb, each $n^{th}$ overlapping pair of Fourier series components correlated at a cyclic separation $\alpha_n$. The system includes an optical receiver for generating a set of N spectral correlation function (SCF) elements in the electrical domain, each $n^{th}$ SCF element comprising an in-phase/quadrature (I/Q) component of a product of the complex conjugate of each Fourier series component selected from the filtered offset comb and an overlapping Fourier series component selected from the filtered signal comb. The system includes an analog-digital converter (ADC) array for outputting an SCF slice in the digital domain by digitizing the N electrical-domain SCF elements, the SCF slice associated with an RF center frequency and a set of N cyclic separations $\alpha_1, \alpha_2, \ldots \alpha_N$.

In some embodiments, the secondary optical filters select the $m^{th}$ Fourier series component of each comb tone of the first filtered offset comb, and each $n^{th}$ SCF element is an I/Q component of a product of a complex conjugate of the $m^{th}$ Fourier series component selected from the filtered offset comb and the corresponding overlapping $m^{th}$ first Fourier series component selected from the filtered signal comb.

In some embodiments, each of the M*N Fourier series components of the filtered signal comb are separated by a spectral separation $k\delta f$, and each of the M*N Fourier series components of the filtered offset comb are separated by a spectral separation $k\delta f$ (where k is an integer).

In some embodiments, the optical receiver includes an arrangement of 1) arrayed waveguide gratings (AWG) for splitting the output of the secondary periodic optical filters into N individual optical lines and a coherent detector array and 2) coherent detectors (e.g., hybrid optical couplers and photodetector arrays) for generating the N SCF elements from the individual optical lines in the electrical domain.

In some embodiments, each SCF slice corresponds to a time instance.

In some embodiments, the pair of secondary periodic optical filters are tunable by an electrical ramp function (e.g., to an FSR $\Delta F+\delta F$) to cycle the center frequency through a set of M center frequencies $f_{CW}+f_1, f_{CW}+f_2, \ldots f_{CW}+f_M$ (e.g., for each time instance $t_m \in t_1, t_2, \ldots t_M$) such that the ADC array outputs a full stream of the SCF for the RF input signal of interest, e.g., an M-slice by N-element matrix where each $m^{th}$ SCF slice at a time instance $t_m$ corresponds to an RF center frequency $f_m$ and to the set of N cyclic separations $\alpha_1, \alpha_2, \ldots \alpha_N$.

In some embodiments, the primary and secondary periodic optical filters include Fabry-Perot filters and/or ring resonators.

In some embodiments, the system includes an optical coupler for splitting the photonic carrier into optical paths for the signal comb and offset comb.

In a further aspect, a method for estimation and streaming of the SCF for an RF signal of interest in the analog domain is also disclosed. In embodiments, the method includes providing a photonic carrier via a CW laser (at optical frequency $f_{CW}$) or like photonic source. The method includes generating, via a first optical frequency comb generator (OFCG) driven by a first RF signal, a signal comb by replicating the photonic carrier onto a uniform frequency grid, the signal comb comprising a set of N comb tones separated by a repetition rate $\Delta F$. The method includes generating, via a second OFCG driven by a second RF signal, an offset comb by replicating the photonic carrier onto a second uniform frequency grid, the offset comb comprising a set of N comb tones separated by an offset repetition rate $\Delta F+\delta F$. The method includes amplitude modulating the signal comb and offset comb based on the RF input signal of interest. The method includes filtering, via a set of primary periodic optical filters, the signal comb and the offset comb, the filtered signal comb comprising M Fourier series components per comb tone (e.g., M*N total components) and the filtered offset comb comprising M Fourier series components per comb tone correlated with the M*N components of the filtered signal comb at a spectral separation kδf (wherein k is an integer). The method includes selecting, via a set of secondary periodic optical filters, 1) a set of N Fourier series components from the filtered offset comb, one component for each comb tone, and 2) the Fourier series component of the filtered signal comb overlapping in optical frequency with each Fourier component selected from the filtered offset comb (each $n^{th}$ pair of Fourier series components corresponding to an overlapping optical frequency and to a cyclic separation αn). The method includes generating, via an optical receiver, a set of N spectral correlation function (SCF) elements in the electrical domain, each $n^{th}$ SCF element comprising an in-phase/quadrature (I/Q) component of a product of the complex conjugate of the $m^{th}$ Fourier component of the filtered offset comb and the overlapping Fourier component of the filtered signal comb. The method includes outputting, via an analog-digital converter (ADC) array, an SCF slice in the digital domain by digitizing the set of N electrical-domain spectral correlation function (SCF) elements, the SCF slice associated with an RF center frequency and the sequence of N cyclic separations $\alpha_1, \alpha_2, \ldots \alpha_N$.

In some embodiments, the method includes generating the second filtered offset comb by selecting, via the secondary periodic optical filter, the $m^{th}$ second Fourier series component from each comb tone of the first filtered offset comb.

In some embodiments, the method includes cycling, via a pair of secondary periodic optical filters driven by an electrical ramp function (e.g., at FSR ΔF+δF), the center frequency of the secondary periodic optical filters through a sequence of M center frequencies $f_{CW}+f_1$, $f_{CW}+f_2$, . . . $f_{CW}+f_M$ at time instances $t_1, t_2, \ldots t_M$ such that the ADC output is a full streaming sparse representation of the SCF for the RF input signal of interest, e.g., an M-by-N-element matrix comprising M SCF slices, each $m^{th}$ SCF slice at a time instance $t_m$ corresponding to an RF center frequency $f_m$ and to the set of N cyclic separations $\alpha_1, \alpha_2, \ldots \alpha_N$.

In some embodiments, each primary or secondary periodic optical filter includes a Fabry-Perot filter and/or ring resonator.

In some embodiments, the method includes replicating the photonic carrier into a first optical path associated with the signal comb and a second optical path associated with the offset comb.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

and FIGS. 8A through 8C are flow diagrams illustrating a method for real-time SCF estimation and streaming according to example embodiments of this disclosure.

DETAILED DESCRIPTION

Figure 1:
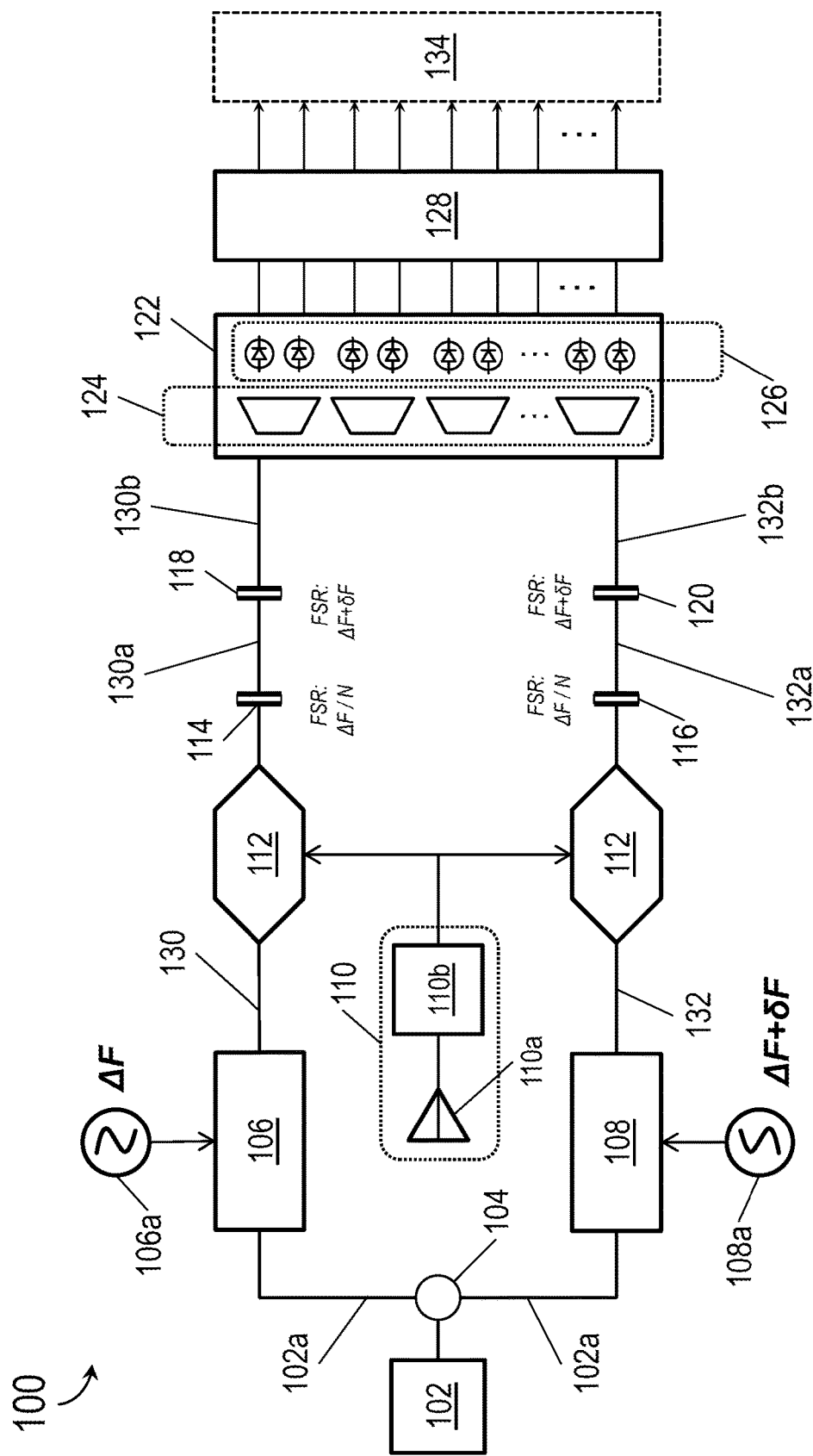
FIG. 1 is a block diagram illustrating a system for real-time analog estimation and streaming of a spectral correlation function (SCF) for a received RF signal according to example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Broadly speaking, embodiments of the inventive concepts disclosed herein are directed to a system and method for implementing a photonic computational engine based on Vernier offset optical frequency combs to perform FFT and correlation operations in the optical domain, streaming a sparse representation of the full SCF (or individual slices thereof) in real time. With respect to the inbound RF signal and the corresponding SCF, the bandwidth is limited only by the bandwidth of the component amplitude modulators (e.g., 50 GHz is contemplated). With respect to SCF computations in the optical domain, latency is proportional solely to the length of optical fibers or optical media connecting the system components (e.g., <100 ns is contemplated).

FIG. 1—System Overview

Referring to FIG. 1, a system 100 for spectral correlation function (SCF) estimation and streaming is shown. The system 100 may include: photonic source 102; optical coupler 104; optical frequency combs 106, 108; RF signal source 110; electro-optical (EO) amplitude modulators 112; primary periodic optical filters 114, 116; secondary periodic optical filters 118, 120; optical receiver 122 (including, e.g., arrayed waveguide gratings 124 (AWG) and coherent detector array 126); and analog-digital converter (ADC) array 128.

In embodiments, the photonic source 102 may include a continuous-wave (CW) laser source configured to generate a CW photonic carrier 102a at an optical frequency $f_{CW}$. For example, the photonic carrier 102a may be split by the optical coupler 104 (e.g., ~3 dB) into two copies, each copy defining an optical path.

In embodiments, two optical frequency combs 106, 108 may be generated with free spectral ranges (FSR) of $\Delta F$ and $\Delta F+\delta f$ (e.g., per signal generators 106a, 108a). For example, the optical frequency combs 106, 108 may each replicate an incoming photonic carrier 102a onto a uniform frequency grid, generating a signal comb 130 (e.g., $E_S$) and an offset comb 132 (e.g., $E_{LO}$). In embodiments, the signal comb 130 may comprise a set of N frequency tones (e.g., comb tones; where N is an integer) pitched in frequency by a repetition rate $\Delta F$ (e.g., each consecutive pair of comb tones is separated by $\Delta F$). Similarly, the offset comb 132 may comprise a set of N comb tones pitched in frequency by a repetition rate $\Delta F+\delta f$ (e.g., offset relative to the repetition rate $\Delta F$ of the signal comb 130).

In embodiments, the RF signal source 110 may receive and process an inbound RF signal of interest (e.g., via antenna elements 110a and/or RF amplifiers/filters 110b). For example, the amplitude modulators 112 may comprise Mach-Zehnder modulators (MZM) or any appropriate like EO amplitude modulators known in the art. In embodiments, the amplitude modulators 112 provide amplitude modulation of the signal comb 130 and the offset comb 132 according to the received inbound RF signal.

In embodiments, the primary periodic optical filters 114, 116 and secondary periodic optical filters 118, 120 may include Febry-Perot filters, ring resonators, or any other like appropriate tunable optical filter known in the art. For example, the primary periodic optical filters 114, 116 may be tunable to FSR $\delta f=\Delta F/N$ for integration of Fourier series components (e.g., discrete Fourier transform (DFT) coefficients) of the RF spectrum by periodically filtering the signal comb (130a) and offset comb (132a), respectively. Similarly, the secondary periodic optical filters 118, 120 may be tunable to FSR $\Delta F+\delta f$ for selection, at a given time instance $t_m$, the $m^{th}$ Fourier series component from each comb tone of the filtered offset comb 132a and corresponding overlapping Fourier series component from the filtered signal comb 130a. For example, the secondary periodic optical filters 118, 120 may output a filtered signal comb 130b and filtered offset comb 132b comprising the $m^{th}$ Fourier series component from each comb tone of the filtered offset comb 132a paired with a corresponding and overlapping Fourier series component of the filtered signal comb 130a.

In embodiments, the optical receiver 122 may perform separation (e.g., via AWG array 124) of each pair of overlapping Fourier series components of the filtered signal comb 130b and filtered offset comb 132b in the optical domain. Similarly, the optical receiver 122 may perform conjugate multiplication (e.g., via coherent detector array 126), outputting in/phase and quadrature (I/Q) components of the product of the complex conjugate of each Fourier series component of the filtered offset comb 132b and the corresponding Fourier series component of the filtered signal comb 130b in the electrical domain. Further, in embodiments the I/Q components output by the optical receiver 122 may be digitized by the ADC array 128, resulting in an N-element slice 134 of the SCF at the time instance $t_m$, wherein each $n^{th}$ pair (where n is an integer such that $1 \leq n \leq N$) of the $m^{th}$ Fourier series component of the filtered offset comb 132a and its corresponding and overlapping Fourier series component of the filtered signal comb 130a being correlated at a cyclic separation $\alpha_n$ of a sequence or set of cyclic separation variables $\alpha_n \in \alpha_1, \alpha_2, \ldots \alpha_N$.

Figure 2A:
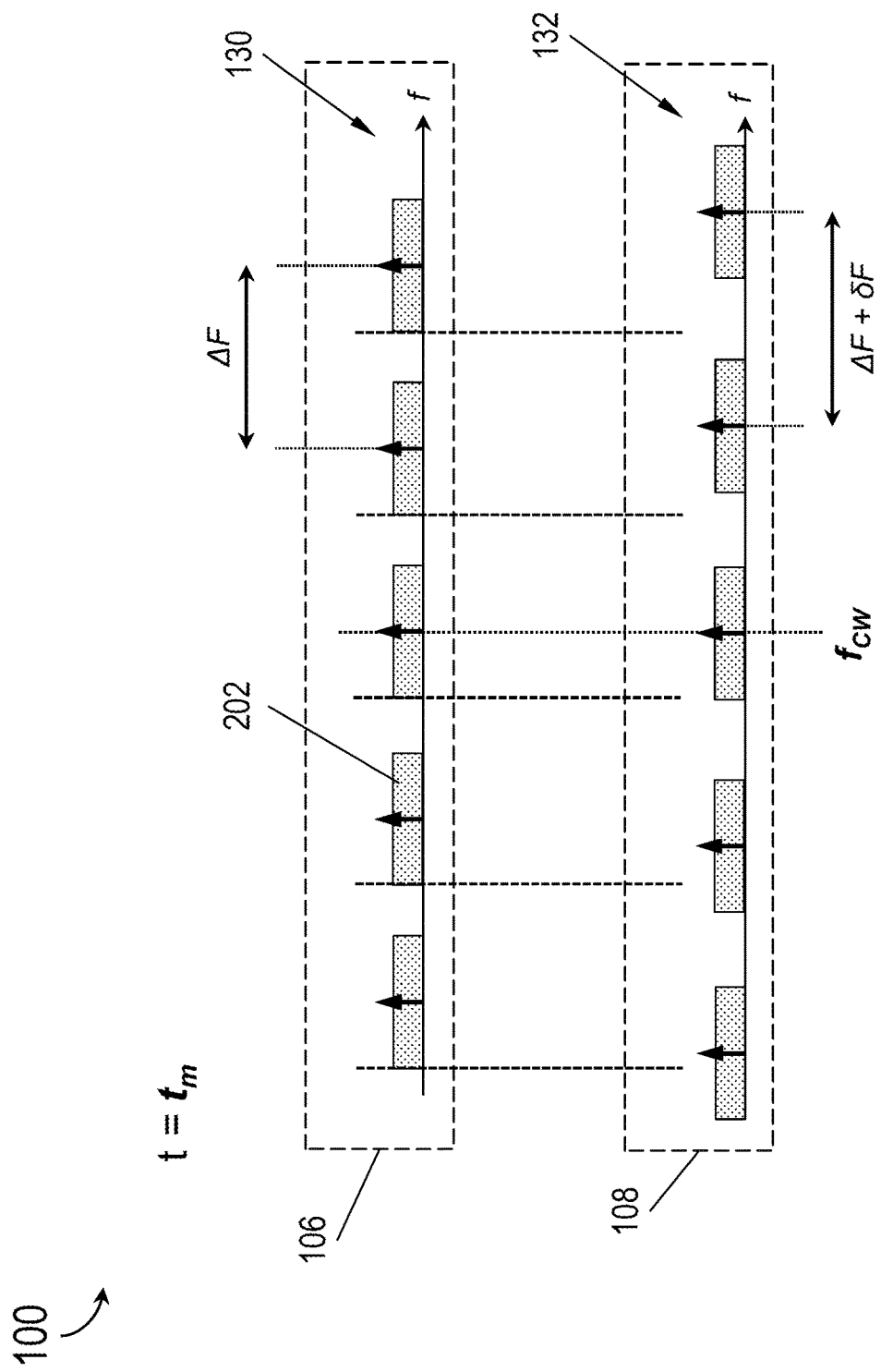
FIG. 2A is a diagrammatic illustration of the optical frequency comb generators (OFCG) of the system of FIG. 1.
Figure 2B:
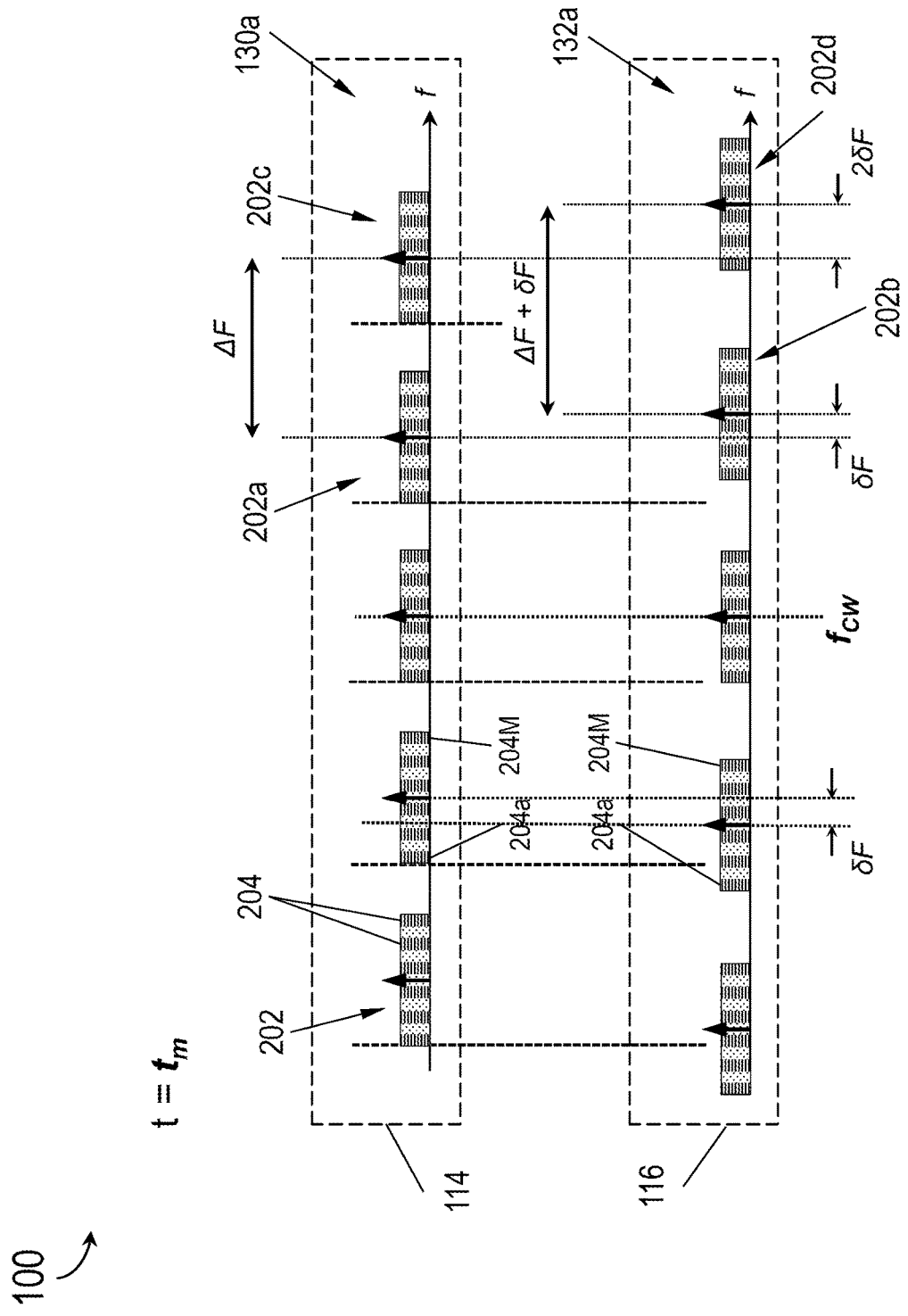
FIG. 2B is a diagrammatic illustration of the primary periodic optical filters of the system of FIG. 1.
Figure 2C:
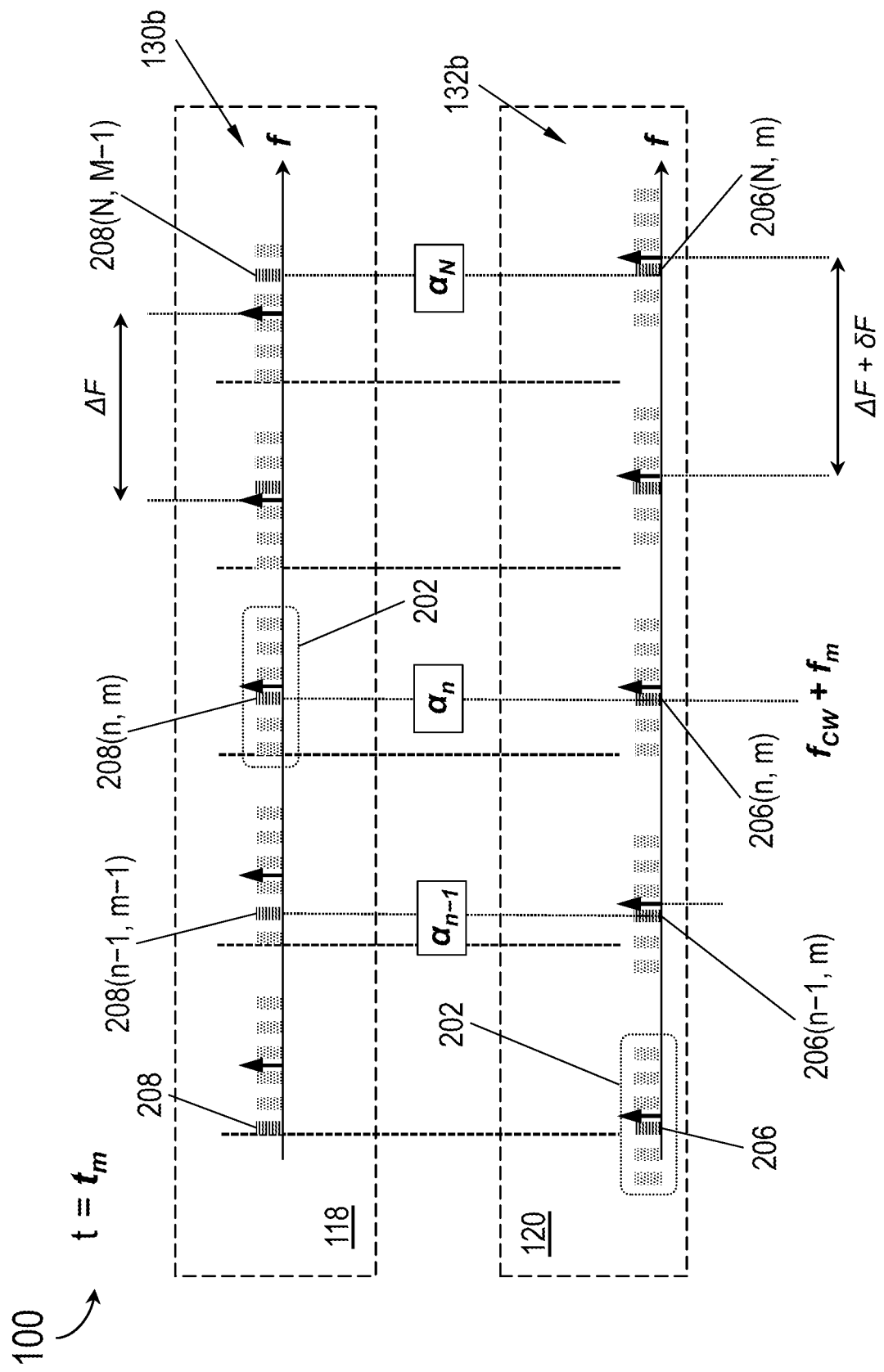
FIG. 2C is a diagrammatic illustration of the secondary periodic optical filters of the system of FIG. 1.

FIGS. 2A Through 2C—Filtering Operations

Referring now to FIGS. 2A through 2C, the periodic optical filters 114, 116 are shown at the time instance $t_m$.

Referring first to FIG. 2A, the optical frequency combs 106, 108 are shown.

In embodiments, the optical frequency combs 106 (driven by repetition rate $\Delta F$) and 108 (driven by repetition rate $\Delta F+\delta F$) may respectively replicate RF spectra onto two different uniform frequency grids, resulting in the signal comb 130 and the offset comb 132. For example, the signal comb 130 and the offset comb 132 may each comprise N comb tones 202. With respect to the signal comb 130, each comb tone 202 to the left or right of the center comb line corresponding to the optical frequency $f_{CW}$ of the photonic carrier (102, FIG. 1) may be shifted by $\pm\Delta F$ according to the first repetition rate. Similarly, with respect to the offset comb 132, each comb tone 202 to the left or right of the center comb line may be shifted by $\pm(\Delta F \pm \delta F)$ according to the second repetition rate.

Referring also to FIG. 2B, the primary periodic optical filters 114, 116 are shown.

In embodiments, the primary periodic optical filters 114, 116 (e.g., tuned to FSR $\Delta F/N$, with center frequency chosen to filter the Fourier series component at optical frequency $f_{CW}+f_m$) may integrate Fourier series components 204 of the RF spectra replicated onto the signal comb 130 and offset comb 132 by periodically filtering the RF spectra, producing the filtered signal comb 130a and the filtered offset comb 132a. For example, the primary periodic optical filters 114, 116 may respectively output a filtered signal comb 130a and a filtered offset comb 132a, the filtered signal comb 130a and the filtered offset comb 132a both comprising M*N Fourier series components 204, 204a-M (wherein M is an integer number of Fourier series components per each of N comb tones).

In embodiments, the M*N Fourier series components 204a-204M of the filtered signal comb 130a and the M*N Fourier series components 204a-204M of the filtered offset comb 132a may be correlated similarly to the component comb tones 202 of the filtered signal comb and the filtered offset comb. For example, with respect to the first pair of comb tones 202a, 202b (e.g., of the filtered signal comb 130a and filtered offset comb 132a respectively) to the right of the center comb line (e.g., optical frequency $f_{CW}$) each of the M Fourier series components 204a-204M of the comb tone 202b may be correlated with its counterpart Fourier series component of the comb tone 202a at a spectral separation $\alpha=\delta F$ (e.g., "alpha"). Similarly, with respect to the next pair of comb tones 202c, 202d, each Fourier series component 204a-204M of the comb tone 202d (of the filtered offset comb 132a) may be correlated with its counterpart Fourier series component of the comb tone 202a (of the filtered signal comb 130a) at a spectral separation $\alpha=2\delta F$, and so forth.

Referring also to FIG. 2C, the secondary periodic optical filters 118, 120 are shown. In embodiments, the secondary periodic optical filter 120 may generate a second filtered offset comb 132b by filtering out one Fourier series component 206 from each comb tone 202 of the filtered offset comb 132a output by the primary periodic optical filter (116, FIG. 2B). Similarly, the secondary periodic optical filter 118 may generate a second filtered signal comb 130b by filtering out one Fourier series component 208 from each comb tone 202 of the filtered signal comb 130a output by the primary periodic optical filter (114, FIG. 2B).

In embodiments, the secondary periodic optical filters 118, 120 (e.g., tuned to FSR $\Delta F+\delta F$) may select (e.g., with center frequency chosen to filter the Fourier series component at optical frequency $f_{CW}+f_m$) one $m^{th}$ two-dimensional filtered Fourier series component 206(n, m) from each $n^{th}$ comb tone 202 of the filtered offset comb 132a and a corresponding overlapping (e.g., with respect to the overlapping optical frequency $f_{CW}+f_m$) $m^{th}$ two-dimensional filtered Fourier series component 208(n, m) from the filtered signal comb 130a. For example, at a time instance $t_m$, the filtered offset comb 132b output by the secondary periodic optical filter 120 may comprise a set of N Fourier series components 206, one Fourier series component 206(n–1, m), 206(n, m), 206(N, m) for each $n^{th}$ comb tone 202 of the filtered offset comb 132a. Similarly, the filtered signal comb 130b output by the secondary periodic optical filter 118 at the time instance $t_m$ may comprise a different set of N Fourier series components 208 (also sharing the same optical frequencies as the set of N Fourier series components 206 selected from the filtered offset comb 132a), each $m^{th}$ Fourier series component 208(n–1, m–1), 208(n, m), ... 208(N, M–1) of the filtered signal comb 130b overlapping with a corresponding $m^{th}$ Fourier series component 206(n–1, m), 206(n, m), ... 206 (N, m) of the filtered offset comb 132b. For example, each $n^{th}$ pair of a Fourier series component 206(n–1, m), 206(n, m), ... 206(N, m) of the filtered offset comb 132b and its overlapping counterpart Fourier series component 208(n–1, m–1), 208(n, m), ... 208(N, M–1) of the filtered signal comb 130b may be correlated at a cyclic separation an. In embodiments, the cyclic separation variable an (e.g., "alpha") may be defined as the RF frequency difference between each Fourier series component 206(n–1, m), 206(n, m), ... 206(N, m) and its overlapping counterpart 208(n–1, m–1), 208(n, m), ... 208(N, M–1), where $\alpha_n \in \alpha_1, \alpha_2, \ldots \alpha_N$ (e.g., a sequence or set of cyclic separations). Similarly, in embodiments m may be defined ordinally as the $m^{th}$ Fourier series component 206 selected from each comb tone 202 of the filtered offset comb 132a to produce the filtered offset comb 132b, and M may be defined as the number of Fourier coefficients 206, 208 per comb tone 202. Accordingly, M may also be the number of time instances (e.g., $t_m \in t_1, t_2, \ldots t_m$) necessary to generate a sparse representation of the full SCF, as described in greater detail by FIG. 4 below.

FIG. 3—SCF Slice

Figure 3:
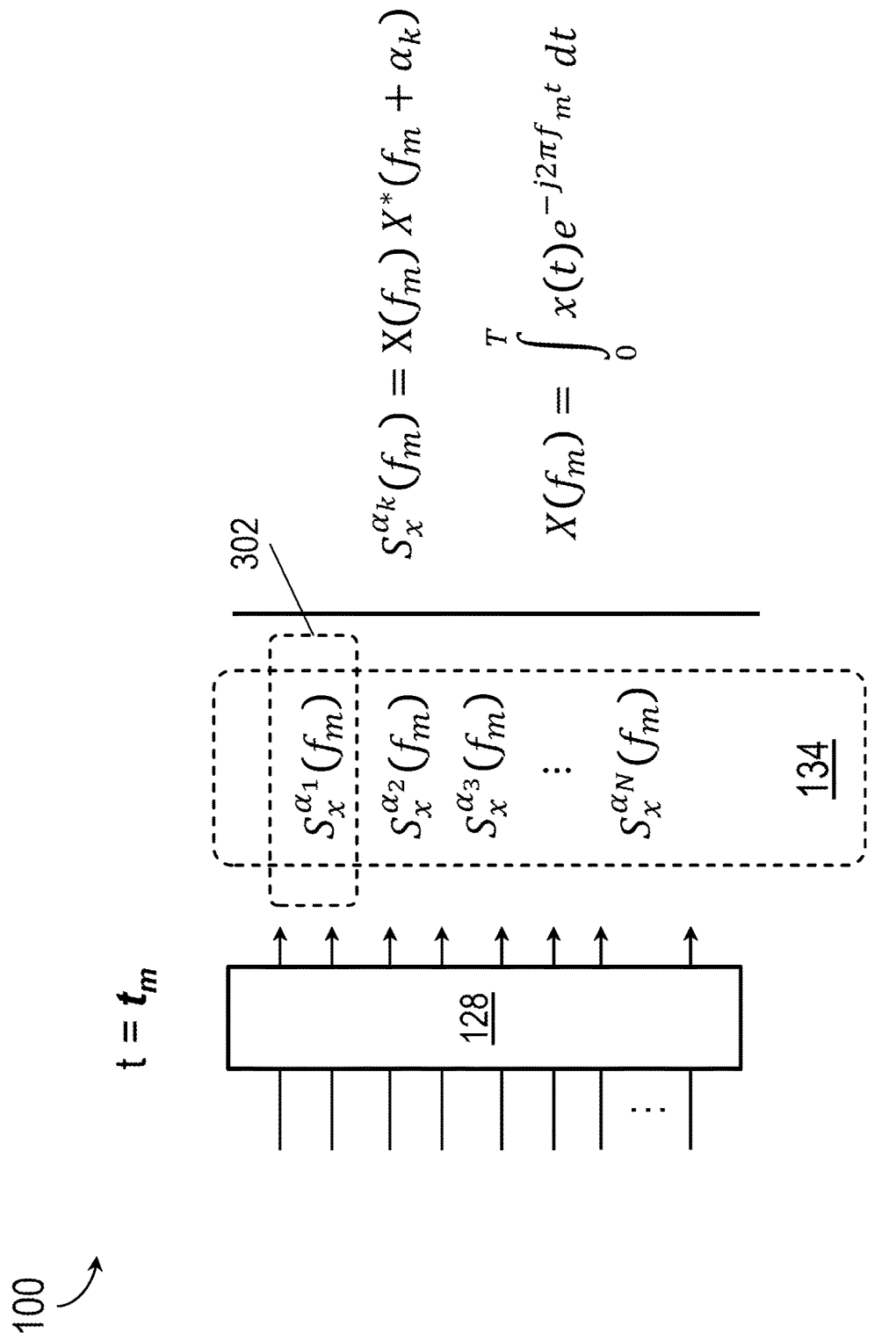
FIG. 3 illustrates a slice of the SCF output by the system of FIG. 1.

Referring now to FIG. 3, the ADC array 128 is shown.

In embodiments the filtered signal comb (130b, FIG. 2C) and filtered offset comb (130b, FIG. 2C) may pass through the optical receiver (122, FIG. 1) for separation (e.g., separation of the filtered signal comb and the filtered offset comb into individual optical fibers or lines via AWG array (124, FIG. 1), wavelength division multiplexers (WDM), or any other like appropriate optical demultiplexer), conjugate multiplication, and conversion into the electrical domain (e.g., via coherent detector array (126, FIG. 1)), and finally through the ADC array 128 for digitization. For example, at the time instance $t_m$ the ADC array 128 may output a slice 134 of the spectral correlation function (SCF) of the RF input signal, the SCF slice comprising N elements 302, each element corresponding to a Fourier series component of the input RF signal at frequency $f_m$ (FIG. 2C: 206(n–1, m), 206(n, m), 206(N, m)) of the filtered offset comb (132b, FIG. 2C)) correlated at a cyclic separation $\alpha_n \in \alpha_1, \alpha_2, \ldots \alpha_N$ to its corresponding Fourier series component (FIG. 2C: 208 (n–1, m–1), 208(n, m), 208(N, M–1)) of the filtered signal comb (130b, FIG. 2C).

In embodiments, where the SCF is defined as:

$$S_x^\alpha(f) = \lim_{T\to\infty}\left\{\frac{1}{T}X_T(t,f)X_T^*(t,f+\alpha)\right\}$$

where $$X_T(t,f) \triangleq \int_{t-\frac{T}{2}}^{t+\frac{T}{2}} x(u)e^{-j2\pi fu}du$$

and x(t) is the inbound RF signal received and processed by the RF signal source (110, FIG. 1), the inbound RF signal assumed absolutely integrable on finite intervals, then each individual element 302 of the SCF slice 134 (e.g., at a time instance $t_m$) may correspond to a component of the SCF $$S_x^{\alpha_n}(f_m)$$

at the RF input frequency $f_m$, by correlating to a pair of overlapping Fourier series components (e.g., 206(n, m), 208(n, m)) at a cyclic separation $\alpha_n \in \{\alpha 1, \alpha_2, \ldots \alpha N\}$. Accordingly, $$S_x^{\alpha_n}(f_m) = X(f_m)X^*(f_m + \alpha_n)$$

and $$X(f_m) = \int_0^T x(t)e^{-j2\pi f_m t} dt.$$

Figure 4:
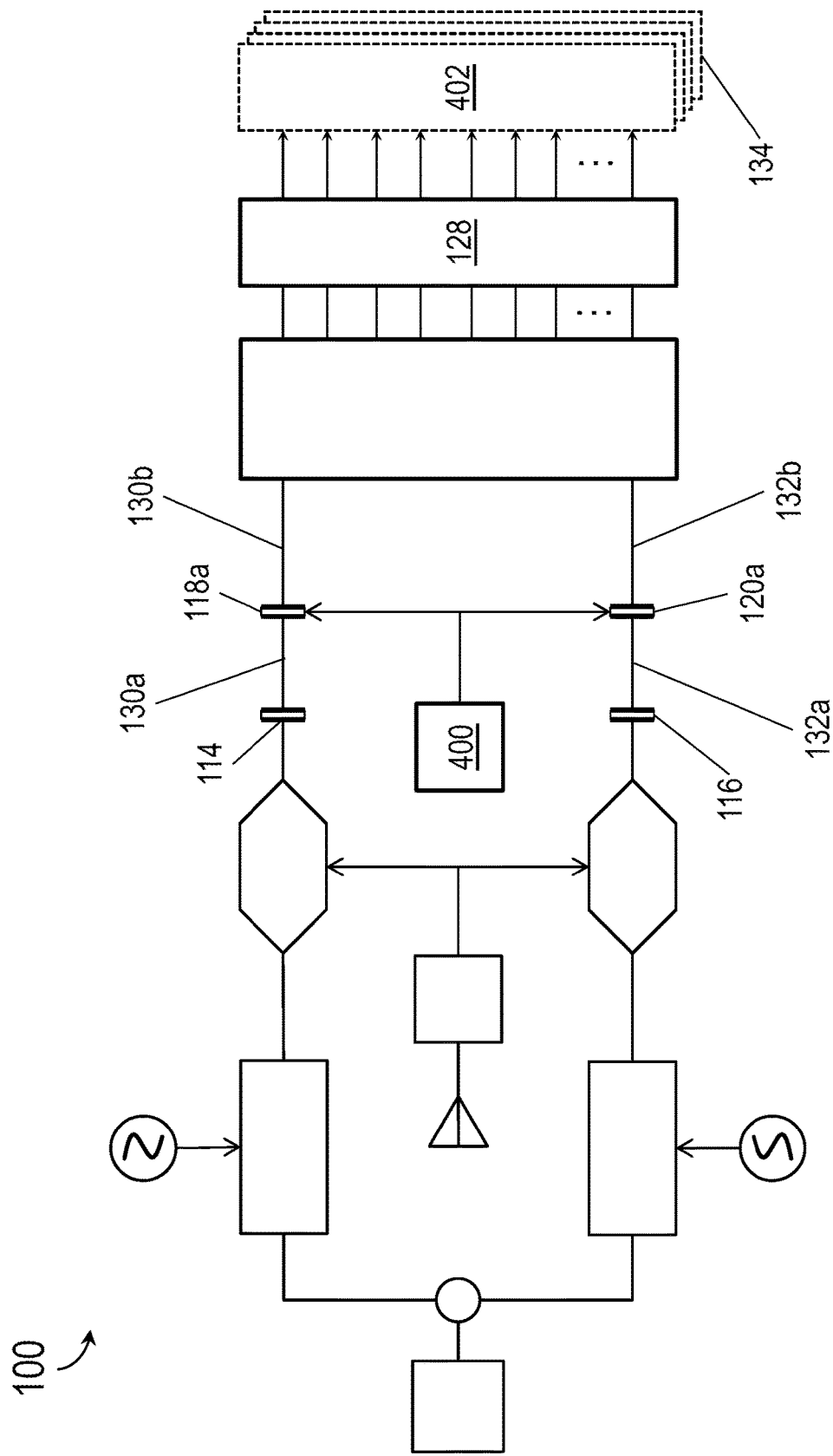
FIG. 4 is a block diagram illustrating the system of FIG. 1 incorporating an electrical ramp function for real-time estimation and streaming of the full SCF.

FIG. 4—Ramp Function

Referring now to FIG. 4, the system 100 is shown.

The secondary periodic optical filters 118a, 120a may be implemented and may function similarly to the secondary periodic optical filters 118, 120 shown by FIGS. 1 and 2B, except that in some embodiments the secondary periodic optical filters 118a, 120a may be driven by an electrical ramp function 400. For example, the ramp function 400 may tune the secondary periodic optical filters 118a, 120a with FSR ΔF+δF such that the center frequency $f_{CW}+f_m$ of the secondary periodic optical filter is sequentially varied (e.g., cycled through a set of M optical center frequencies $f_{CW}+f_1$, $f_{CW}+f_2, \ldots f_{CW}+f_M$). In embodiments, the output of the ADC array 128 may be not an individual SCF slice (134, FIG. 3) but a full stream 402 of the SCF (e.g., comprising M SCF slices 134) as described in greater detail below.

Figure 5:
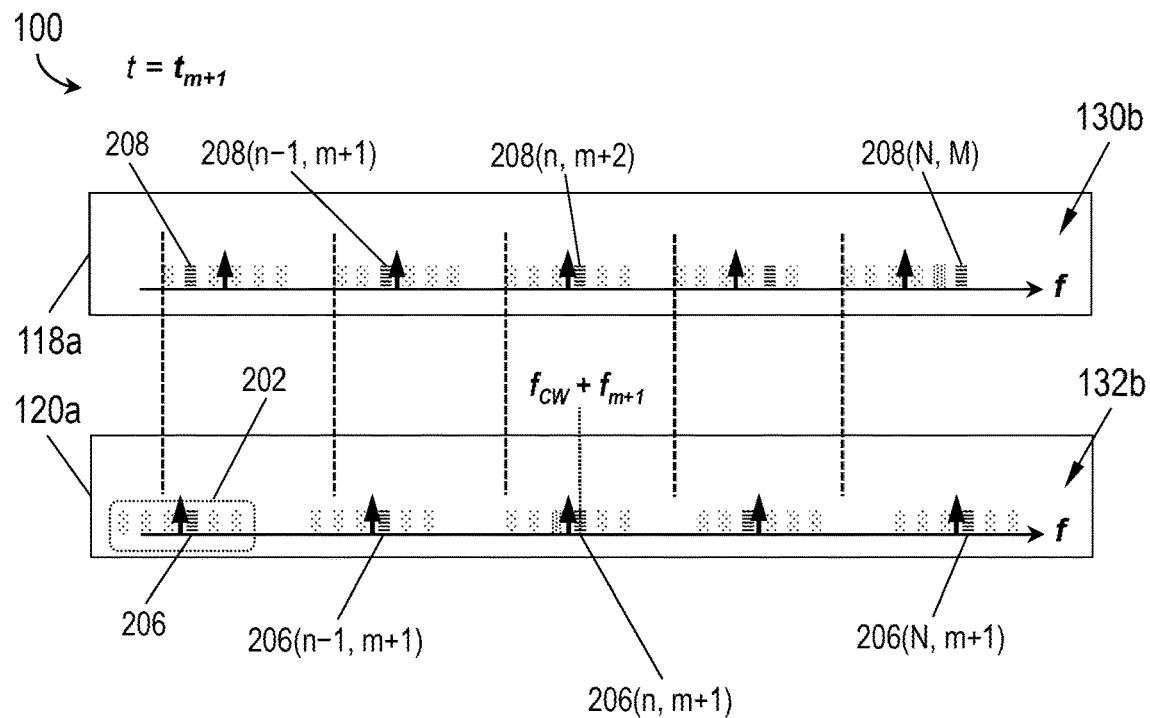
FIG. 5 is a diagrammatic illustration of the secondary periodic optical filters driven by the ramp function of the system of FIG. 4.
Figure 6:
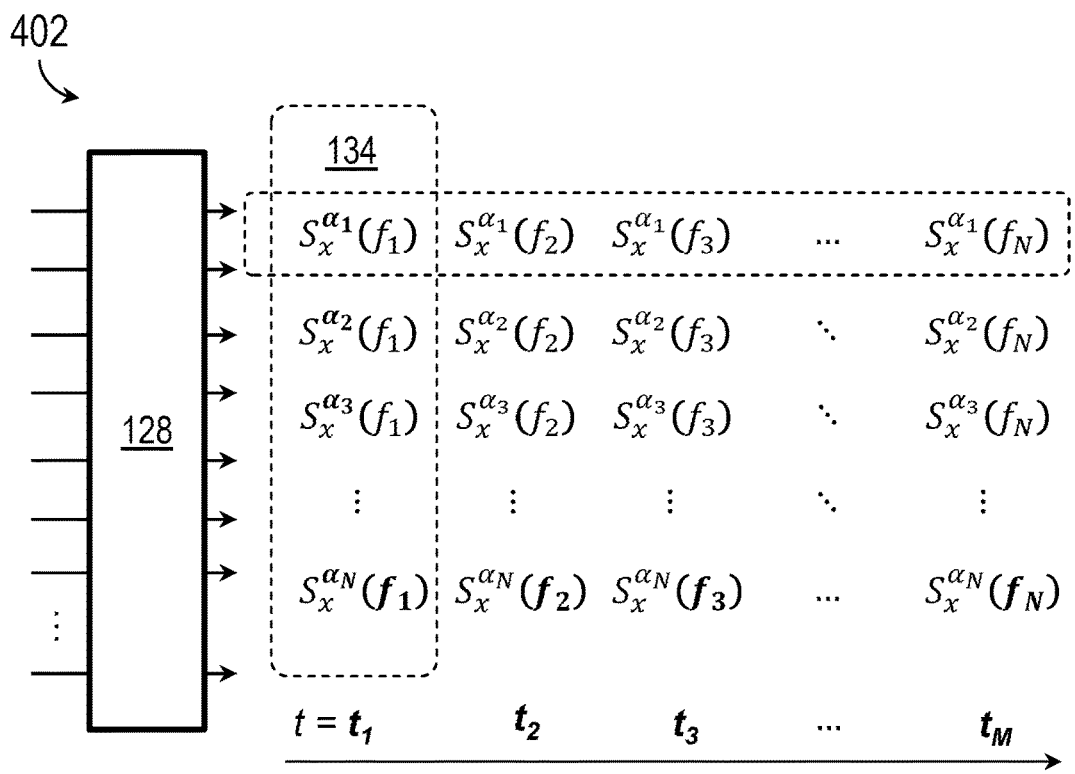
FIG. 6 illustrates the full streaming SCF estimation output by the system of FIG. 4.

FIGS. 5 and 6—Sequential Filtering

Referring now to FIGS. 5 and 6, the secondary periodic optical filters 118a, 120a of the system 100 and the ADC array 128 are respectively shown.

In embodiments, the secondary periodic optical filters 118a, 120a may be implemented and may function similarly to the secondary periodic optical filters 118, 120 shown by FIGS. 1 and 2B (e.g., at a time instance $t_m$ and center frequency $f_{CW}+f_m$) except that the secondary periodic optical filters 118a, 120a, at subsequent time instances $t_m \in t_1$, $t_2, t_3, \ldots t_M$ (e.g., where m is an integer such that 1≤m≤M), may cycle the center frequency of the secondary periodic optical filters through center frequencies $f_{CW}+f_m$, $f_m \in f_1, f_2, f_3, \ldots f_M$, such that at each subsequent time instance $t_{m+1}$ the (m+1)th Fourier series component 206(n−1, m+1), 206(n, m+1), ... 206(N, m+1) is selected from each $n^{th}$ comb tone 202 of the filtered offset comb (132a, FIG. 2B) and the corresponding overlapping Fourier series component 208 (n−1, m+1), 208(n, m+2), 208(N, M) is selected from the filtered signal comb (130a, FIG. 2B), thereby generating at each time instance $t_{m+1}$ a (second) filtered offset comb 132b and a (second) filtered signal comb 130b by selecting an (m+1)th Fourier series component 206 from the filtered offset comb 132a and a corresponding Fourier series component 208 with overlapping optical frequency from the filtered signal comb 130a.

Referring in particular to FIG. 6, in embodiments, when the secondary periodic optical filters 118a, 120a are driven by the ramp function (400, FIG. 4), the output of the ADC array 128 may be a full stream 402 of the SCF. For example, the full stream 402 may comprise a sparse representation of the full SCF, e.g., a two-dimensional M-by-N-element matrix wherein, at each time instance $t_1, t_2, \ldots t_M$, the system 100 outputs a slice 134 of the SCF (e.g., M slices total), each individual SCF slice corresponding to a center frequency $f_m$ and a time instance $t_m$, and comprising a correlation of each $m^{th}$ pair of a Fourier series component (FIG. 5: 206(n−1, m+1), 206(n, m+1), ... 206(N, m+1)) from the filtered offset comb (132b, FIG. 5) and its overlapping Fourier series component (FIG. 5: 208(n−1, m+1), 208(n, m+2), 208(N, M)) from the filtered signal comb 130a at a cyclic separation $\alpha_n \in \alpha_1, \alpha_2, \ldots \alpha_N$, cycling through the center frequencies $f_{CW}+f_m$, $f_m \in f_1, f_2, \ldots f_m$ at each subsequent time instance $t_m \in t_1, t_2, \ldots t_M$.

Figure 7:
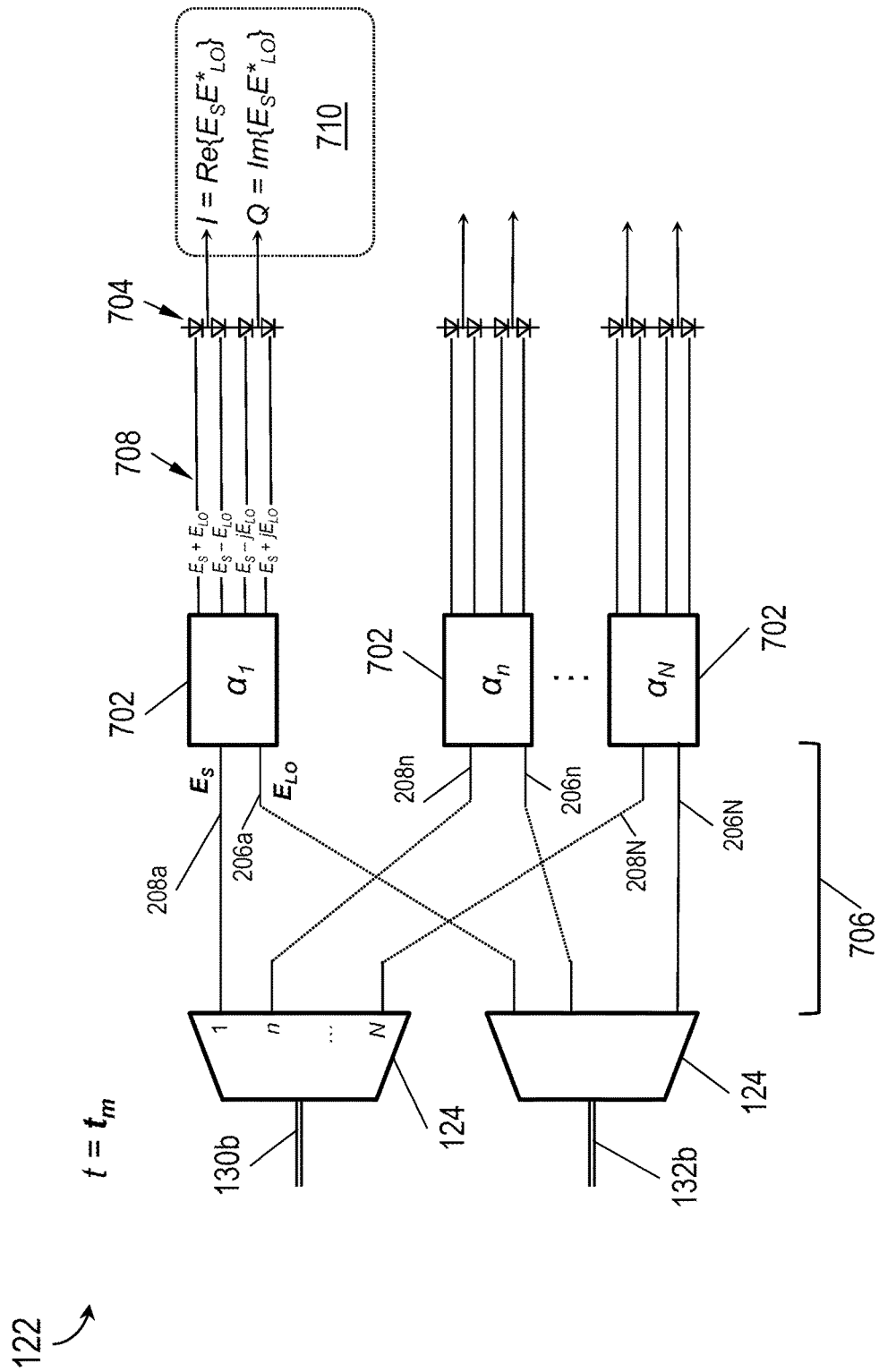
FIG. 7 is a block diagram illustrating configurations of the optical receiver of the system of FIGS. 1 and 4.

FIG. 7—Optical Receiver Array Configurations

Referring to FIG. 7, the optical receiver 122 is shown.

In embodiments, the optical receiver 122 may be implemented via various configurations of arrayed waveguide gratings 124 (AWG) and coherent detectors 126 (including, e.g., hybrid optical couplers 702 and photodetectors 704).

For example, the filtered signal comb 130b and filtered offset comb 132b may be passed through AWGs 124 (e.g., at a time instance $t_m$) to split the N individual Fourier series components (206a, ... 206n, ... 206N; FIG. 2C: 206(n−1, m), 206(n, m), 206(N, m); FIG. 5: 206(n−1, m+1), 206(n, m+1), ... 206(N, m+1)) of the filtered signal comb and the N individual Fourier series components (208a, ... 208n, ... 208N; FIG. 2C: 208(n−1, m−1), 208(n, m), ... 208(N, M−1); FIG. 5: 208(n−1, m+1), 208(n, m+2), 208(N, M)) of the filtered offset comb into individual optical fibers or lines (706). In embodiments, each pair of overlapping Fourier series components (e.g., the selected Fourier series component 206a-206N of the $n^{th}$ comb tone of the filtered offset comb 132b ($E_{LO}$) and the corresponding overlapping Fourier series component 208a-208N of the filtered offset comb 130b ($E_S$) at a cyclic separation $\alpha_n \in \alpha_1, \alpha_2, \ldots \alpha_N$) may be passed to one of N 90-degree hybrid optical couplers 702. For example, at each time instance $t_m \in t_1, t_2, \ldots t_N$, each hybrid optical coupler 702 may produce a set of four outputs (708), which the photodetectors 704 may convert into the electrical domain equivalent of the in-phase (I) and quadrature (Q) components (710) of the product of the complex conjugate of each selected Fourier series component 206a-206N of the filtered offset comb $E_{LO}$ (132b) and the corresponding overlapping Fourier series component 208a-208N of the filtered signal comb $E_S$ (130b). In embodiments, the ADC array (128, FIG. 1) may then convert each set of photodetected I/Q components 710 to the digital domain, producing each element (302, FIG. 3) of an N-element $m^{th}$ SCF slice (134, FIG. 3).

In some embodiments, the optical receiver 122 may be reconfigured by rearranging the number and/or the order of the coherent detectors 126 and AWG 124. By way of a non-limiting example, the optical receiver 122 may be implemented by passing the filtered signal comb $E_S$ 130b and filtered offset comb $E_{LO}$ 132b through a single 90-degree hybrid optical coupler 702, and passing the resulting component outputs thereof passed to four AWGs 124 for separation of each component output into its individual optical lines 706 in the optical domain. Further, the separated individual optical lines may be passed through photodetectors 704 for conversion to electrical-domain in-phase (I) and quadrature (Q) components 710 of the product of the complex conjugate of each $n^{th}$ selected Fourier series component 206a, ... 206n, ... 206N and the corresponding overlapping Fourier series component 208a, ... 208n, ...

208N. In embodiments, the electrical-domain I/Q components 710 may be digitized by the ADC array 128 into SCF slices 134.

Figure 8A:
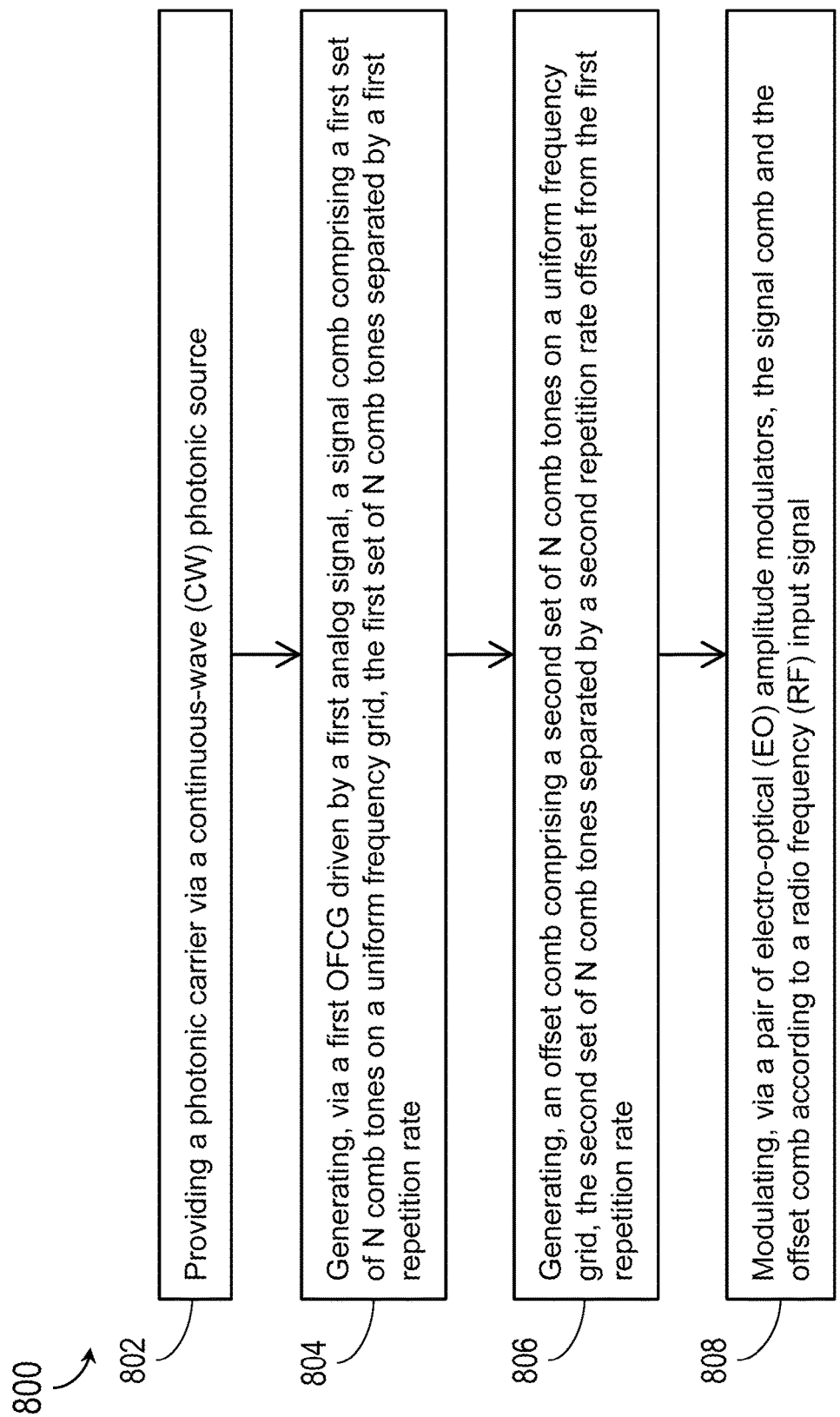

FIGS. 8A Through 8C—Method

Referring to FIG. 8A, the method 800 for real-time estimation and streaming of spectral correlation functions (SCF) may be implemented by embodiments of the system 100 and may include the following steps.

At a step 802, a CW laser or other like photonic source provides a photonic carrier at optical frequency $f_{CW}$.

At a step 804, a first Vernier optical frequency comb generator (OFCG) driven by a first analog signal (e.g., at repetition rate $\Delta F$) generates a signal comb by replicating the photonic carrier onto a uniform frequency grid, the resulting signal comb comprising N comb tones (where N is an integer) separated by the repetition rate $\Delta F$.

At a step 806, a second OFCG driven by a second analog signal (e.g., at repetition rate $\Delta F+\delta F$) generates an offset comb by replicating the photonic carrier onto a second uniform frequency grid, the resulting offset comb also comprising N comb tones but separated by the repetition rate $\Delta F+\delta F$ (e.g., offset from the first repetition rate $\Delta F$).

At a step 808, an inbound RF signal of interest is received and processed, and Mach-Zehnder or other like electro-optical (EO) amplitude modulators modulate the signal comb and the offset comb according to the received RF signal.

Referring also to FIG. 8B, at a step 810, the signal comb and the offset comb are filtered by a pair of primary periodic optical filters (e.g., tunable with an FSR $\Delta F/N$). For example, the filtered signal comb comprises a set of M*N first Fourier series components, e.g., separated by a spectral separation $\delta f$ (e.g., M Fourier series components for each of N comb tones). The filtered offset comb also comprises a set of M*N second Fourier series components.

At a step 812, the filtered signal comb and the filtered offset comb are filtered by a pair of secondary periodic optical filters (e.g., tunable to an FSR $\Delta F+\delta F$). For example, a first secondary periodic optical filter selects from the filtered offset comb a set of N second Fourier series components, and a second secondary periodic optical filters selects from the filtered signal comb a second Fourier series component of the offset comb overlapping with each selected first Fourier series component of the selected filtered signal comb (e.g., with respect to an overlapping optical frequency). Further, each $n^{th}$ pair of an $m^{th}$ second Fourier series component selected from the filtered offset comb and its corresponding overlapping $m^{th}$ first Fourier series component selected from the filtered signal comb also correspond to a cyclic separation an (e.g., of a sequence $\alpha_1$, $\alpha_2$, . . . $\alpha_N$ of N "alphas" or cyclic separation variables).

Referring also to FIG. 8C, at a step 814, an optical receiver generates, based on the second filtered signal comb and the second filtered offset comb output of the pair of secondary periodic optical filters, a set of N spectral correlation function (SCF) elements converted from the optical domain to the electrical domain, each $n^{th}$ SCF element comprising an in-phase/quadrature (I/Q) component of a product of the complex conjugate of the $n^{th}$ pair of an $m^{th}$ second Fourier component selected from the filtered offset comb and the corresponding overlapping $m^{th}$ first Fourier component selected from the filtered signal comb.

At a step 816, an array of analog-digital converters (ADC) outputs a slice of the SCF in the digital domain by digitizing the set of N SCF elements, the SCF slice based on an RF center frequency $f_m$ and a correlation of each product of the complex conjugate of the $m^{th}$ second Fourier component selected from the filtered offset comb and the overlapping $m^{th}$ first Fourier component selected from the filtered signal comb at a cyclic separation $\alpha_n \in \alpha_1, \alpha_2, \ldots \alpha_N$.

In some embodiments, the method 800 may include an additional step 818. At the step 818, the pair of secondary periodic optical filters (driven by an electrical ramp function) cycle the optical center frequency $f_{CW}+f_m$ of the secondary periodic optical filters through a sequence of M center frequencies $f_{CW}+f_1$, $f_{CW}+f_2$, $f_{CW}+f_3$, . . . $f_{CW}+f_M$ at subsequent time instances $t_m \in t_1, t_2, t_3, \ldots t_M$ such that the ADC array streams a full sparse representation of the SCF, e.g., as a two-dimensional (M×N) matrix of M N-element SCF slices, each $m^{th}$ SCF slice corresponding, at a time instance $t_m$ and for a center frequency $f_m$, to a correlation of each product of the complex conjugate of the $m^{th}$ second Fourier component selected from the filtered offset comb and the corresponding overlapping $m^{th}$ first Fourier component selected from the filtered signal comb at a cyclic separation $\alpha_n \in \alpha_1, \alpha_2, \ldots \alpha_N$.

CONCLUSION

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

I claim:

1. A system for analog estimation and streaming of a spectral correlation function (SCF), comprising:
   a continuous-wave (CW) photonic source configured for generating a photonic carrier;
   a pair of optical frequency comb generators (OFCG) coupled to the photonic source and comprising:
   a first OFCG driven by a first analog signal, the first OFCG configured to generate from the photonic carrier a signal comb comprising a first set of N comb tones separated by a first repetition rate, wherein N is an integer;
   and
   a second OFCG driven by a second analog signal, the second OFCG configured to generate from the photonic carrier an offset comb comprising a second set of N comb tones separated by a second repetition rate offset from the first repetition rate;
   a pair of electro-optical (EO) amplitude modulators coupled to the pair of OFCG and respectively configured to modulate the signal comb and the offset comb according to a radio frequency (RF) input signal;

a pair of primary periodic optical filters coupled to the pair of EO amplitude modulators and respectively configured to output a first filtered signal comb comprising M*N first Fourier series components and a first filtered offset comb comprising M*N second Fourier series components correlated with the M*N first Fourier series components, wherein M is an integer number of Fourier series components per comb tone;

a pair of secondary periodic optical filters coupled to the pair of primary periodic optical filters and respectively configured to output a second filtered signal comb based on the first filtered signal comb and a second filtered offset comb based on the first filtered offset comb, the second filtered offset comb comprising one second Fourier series component from each comb tone of the first filtered offset comb and the second filtered signal comb comprising the N first Fourier series components corresponding to each second Fourier series component of the second filtered offset comb, each $n^{th}$ pair of a second Fourier series component of the second filtered offset comb and a corresponding first Fourier series component of the second filtered signal comb corresponding to an overlapping optical frequency and to a cyclic separation $\alpha_n$, wherein n is an integer such that $1 \le n \le N$;

at least one optical receiver coupled to the pair of secondary periodic optical filters and configured for generating at least N electrical-domain spectral correlation function (SCF) elements based on the second filtered signal comb and the second filtered offset comb, each $n^{th}$ SCF element comprising an in-phase/quadrature (I/Q) component of a product of a complex conjugate of a second Fourier series component of the second filtered offset comb and the corresponding overlapping first Fourier series component of the second filtered signal comb;

and an array of analog-digital converters (ADC) coupled to the at least one optical receiver, the array of ADC configured to output at least one digital-domain SCF slice corresponding to the RF input signal by digitizing the N SCF elements, the at least one SCF slice associated with a center frequency and with a sequence of N cyclic separations $\alpha_1, \alpha_2, \ldots \alpha_N$.

2. The system for analog estimation and streaming of a SCF of claim 1, wherein:

the second filtered offset comb comprises the $m^{th}$ second Fourier series component of each comb tone of the first filtered offset comb, wherein m is an integer such that $1 \le m \le M$;

and each $n^{th}$ SCF element comprises an I/Q component of a product of the complex conjugate of the $m^{th}$ second Fourier series component of the second filtered offset comb and the corresponding overlapping $m^{th}$ first Fourier series component of the second filtered signal comb.

3. The system for analog estimation and streaming of a SCF of claim 1, wherein each of the M*N first Fourier series components of the first filtered signal comb and each of the comprising M*N second Fourier series components of the first filtered offset comb are correlated at a spectral separation $k\delta f$, where k is an integer.

4. The system for analog estimation and streaming of a SCF of claim 1, wherein the at least one optical receiver comprises:

a plurality of arrayed waveguide gratings (AWG) configured for splitting each of the second filtered signal comb and the second filtered offset comb into N individual optical lines;

and a coherent detector array configured for generating the at least N electrical-domain SCF elements based on the individual optical lines.

5. The system for analog estimation and streaming of a SCF of claim 1, wherein the at least one SCF slice corresponds to a time instance.

6. The system for analog estimation and streaming of a SCF of claim 5, wherein the photonic carrier is associated with an optical frequency $f_{CW}$, the time instance is a time instance $t_m$, and wherein the center frequency is a center frequency $f_{CW}+f_m$ of the pair of secondary periodic optical filters, and wherein:

the pair of secondary periodic optical filters is tunable by an electrical ramp function to cycle the center frequency $f_{CW}+f_m$ through a sequence of M center frequencies $f_{CW}+f_1, f_{CW}+f_2, \ldots f_{CW}+f_M$;

and the array of ADC is configured to output a M-by-N-element matrix corresponding to a full SCF of the RF input signal, the M-by-N-element matrix comprising M SCF slices, each $m^{th}$ SCF slice corresponding to an RF center frequency $f_m$, to the time instance $t_m$, and to the sequence of N cyclic separations $\alpha_1, \alpha_2, \ldots \alpha_N$.

7. The system for analog estimation and streaming of a SCF of claim 6, wherein each primary periodic optical filter and each secondary periodic optical filter is selected from a group including a Fabry-Perot filter or a ring resonator.

8. The system for analog estimation and streaming of a SCF of claim 1, wherein an optical coupler is configured for replicating the photonic carrier into a first optical path associated with the signal comb and a second optical path associated with the offset comb.

9. A method for analog estimation and streaming of a spectral correlation function (SCF), the method comprising:

providing a photonic carrier via a continuous-wave (CW) photonic source;

generating, via a first optical frequency comb generator (OFCG) driven by a first analog signal, a signal comb comprising a first set of N comb tones on a uniform frequency grid, the first set of N comb tones separated by a first repetition rate, wherein N is an integer;

generating, via a second OFCG driven by a second analog signal, an offset comb comprising a second set of N comb tones on a uniform frequency grid, the second set of N comb tones separated by a second repetition rate offset from the first repetition rate;

modulating, via a pair of electro-optical (EO) amplitude modulators, the signal comb and the offset comb according to a radio frequency (RF) input signal;

generating, by filtering the signal comb and the offset comb via a pair of primary periodic optical filters, a first filtered signal comb and a first filtered offset comb, the first filtered signal comb comprising M*N first Fourier series components and the first filtered offset comb comprising M*N second Fourier series components correlated with the M*N first Fourier series components at a spectral separation $k\delta f$, wherein k is an integer and M is an integer number of Fourier series components per comb tone;

selecting, by filtering the first filtered offset comb and the first filtered signal comb via a pair of secondary periodic optical filters:

at least one second filtered offset comb comprising N second Fourier series components and at least one second filtered signal comb comprising N second Fourier series components, wherein each $n^{th}$ pair of an $m^{th}$ second Fourier series component of the second filtered offset comb and a corresponding $m^{th}$ first Fourier series component of the second filtered signal comb corresponds to an overlapping optical frequency and to a cyclic separation $\alpha_n$, and wherein m and n are integers such that $1 \leq m \leq M$ and $1 \leq n \leq N$;

generating from the second filtered signal comb and the second filtered offset comb, via an optical receiver, at least one set of N electrical-domain spectral correlation function (SCF) elements, each $n^{th}$ SCF element comprising an in-phase/quadrature (I/Q) component of a product of a complex conjugate of a $m^{th}$ second Fourier component and the corresponding overlapping $m^{th}$ first Fourier component;

and outputting, via an array of analog-digital converters (ADC), at least one digital-domain slice of an SCF corresponding to the RF input signal by digitizing the N SCF elements, the SCF slice associated with an RF center frequency $f_m$ and with the sequence of N cyclic separations $\alpha_1, \alpha_2, \ldots \alpha_N$.

10. The method of claim 9, wherein selecting, by filtering the first filtered offset comb and the first filtered signal comb via a pair of secondary periodic optical filters, at least one second filtered offset comb comprising N second Fourier series components includes:

selecting, via the secondary periodic optical filter, the $m^{th}$ second Fourier series component from each comb tone of the first filtered offset comb.

11. The method of claim 9, wherein the photonic carrier is associated with an optical frequency $f_{CW}$ and the center frequency of the pair of secondary periodic optical filters is a center frequency $f_{CW}+f_m$, further comprising:

cycling, by driving the first and second secondary periodic optical filters via an electrical ramp function, the center frequency $f_{CW}+f_m$ through a sequence of M center frequencies $f_{CW}+f_1, f_{CW}+f_2, \ldots f_{CW}+f_M$;

wherein outputting at least one digital-domain slice of an SCF corresponding to the RF input signal via the array of ADC by digitizing the at least one set of N spectral correlation elements includes:

outputting an M-by-N-element matrix corresponding to a full SCF, the M-by-N-element matrix comprising M SCF slices, each $m^{th}$ SCF slice at a time instance $t_m$ corresponding to an RF center frequency $f_m$ and to the sequence of N cyclic separations $\alpha_1, \alpha_2 \ldots \alpha_N$.

12. The method of claim 9, wherein each periodic optical filter is selected from a group including a Fabry-Perot filter or a ring resonator.

13. The method of claim 9, wherein providing a photonic carrier via a CW photonic source includes:

replicating the photonic carrier into a first optical path associated with the signal comb and a second optical path associated with the offset comb.

\* \* \* \* \*